US012028027B2

(12) United States Patent
Cao

(10) Patent No.: US 12,028,027 B2
(45) Date of Patent: Jul. 2, 2024

(54) MATCHING CIRCUIT WITH SWITCHABLE LOAD LINES, LOAD LINE SWITCHING METHOD AND POWER AMPLIFIER

(71) Applicant: Xiumei Cao, Guangdong (CN)

(72) Inventor: Xiumei Cao, Guangdong (CN)

( * ) Notice: Subject to any disclaimer, the term of this patent is extended or adjusted under 35 U.S.C. 154(b) by 456 days.

(21) Appl. No.: 17/311,355

(22) PCT Filed: Mar. 28, 2019

(86) PCT No.: PCT/CN2019/080127
§ 371 (c)(1),
(2) Date: Jun. 7, 2021

(87) PCT Pub. No.: WO2020/113865
PCT Pub. Date: Jun. 11, 2020

(65) Prior Publication Data
US 2022/0029588 A1 Jan. 27, 2022

(30) Foreign Application Priority Data

Dec. 7, 2018 (CN) .......................... 201811493930.X

(51) Int. Cl.
*H03F 1/56* (2006.01)
*H03F 1/14* (2006.01)
(Continued)

(52) U.S. Cl.
CPC ............. *H03F 1/565* (2013.01); *H03F 3/245* (2013.01); *H03F 3/191* (2013.01);
(Continued)

(58) Field of Classification Search
CPC ...... H03F 1/565; H03F 3/245; H03F 2200/06; H03F 2200/09; H03F 2200/165;
(Continued)

(56) References Cited

U.S. PATENT DOCUMENTS

| 10,164,585 | B2 * | 12/2018 | Wada ..................... H03F 3/195 |
| 10,298,273 | B2 * | 5/2019 | Takenaka ................. H03F 3/21 |
| 2016/0080012 | A1 * | 3/2016 | Sun ......................... H03F 3/24 |
| | | | 455/114.2 |

FOREIGN PATENT DOCUMENTS

| CN | 107453719 A | 12/2017 |
| CN | 107769739 A | 3/2018 |
| CN | 207399147 U | 5/2018 |

OTHER PUBLICATIONS

International Search Report of PCT Patent Application No. PCT/CN2019/080127 issued on Sep. 11, 2019.

* cited by examiner

*Primary Examiner* — Khanh V Nguyen

(57) ABSTRACT

The present invention discloses a matching circuit with switchable load lines, a load line switching method and a power amplifier. The matching circuit matches the output impedance of the power amplifier, which amplifies an input signal and outputs an amplified signal. The matching circuit comprises a filter circuit and a switch group for load line selection, the output end of the filter circuit is connected to the switch group. The switch group comprises at least two independent switches, each switch independently constitutes a signal line, and each switch is configured with an external control signal to control on/off. The matching circuit provided by the invention adopts a switch group composed of at least two independent switches, and each independent switch forms a signal line to connect loads, so that multiple loads can be connected at the same time.

8 Claims, 9 Drawing Sheets

(51) Int. Cl.
*H03F 3/24* (2006.01)
*H03F 3/191* (2006.01)

(52) U.S. Cl.
CPC ...... *H03F 2200/06* (2013.01); *H03F 2200/09* (2013.01); *H03F 2200/165* (2013.01); *H03F 2200/222* (2013.01); *H03F 2200/387* (2013.01); *H03F 2200/451* (2013.01); *H03F 2200/541* (2013.01)

(58) Field of Classification Search
CPC ......... H03F 2200/222; H03F 2200/387; H03F 2200/451; H03F 3/72; H03F 3/211; H03F 3/191; H03F 1/56; H03F 1/0277; H03G 1/0088
USPC .................................................. 330/51, 302
See application file for complete search history.

MATCHING CIRCUIT WITH SWITCHABLE LOAD LINES, LOAD LINE SWITCHING METHOD AND POWER AMPLIFIER

TECHNICAL FIELD

The invention relates to a matching circuit with switchable load lines, a load line switching method and a power amplifier.

BACKGROUND

For mobile communication devices such as mobile phones, power amplify modules are used to amplify the radio frequency signals sent to base stations. In order to ensure the stability of the radio frequency signals, the existing power amplify modules generally match the impedance of the radio frequency signals output by the power amplify modules with a matching circuit.

However, the existing matching circuit has only one output load line, which can not connect multiple loads or signal receivers at the same time, and the existing matching circuit can not select specific signal lines as signal input lines and load output lines according to the actual situation.

SUMMARY

In order to solve the problems existing in the prior art, one of the purposes of the present invention is to provide a matching circuit with switchable load lines, which is capable of selecting different load lines according to the load connections.

In order to achieve the purpose of the present invention, a matching circuit with switchable load lines is provided, the matching circuit matches an input impedance and an output impedance of a power amplifier, the power amplifier amplifies an input signal and outputs an amplified signal. The matching circuit further includes a filter circuit and a switch group for load line selection, an output end of the filter circuit is connected to the switch group; the switch group includes at least two independent switches, each switch independently constitutes a signal line, and each switch is configured with an external control signal to control on/off.

Furthermore, the filter circuit has one of the following structures:

1) the filter circuit includes a low-pass filter A and a low-pass filter B, and the ground of the low-pass filter A is separated from the ground of the low-pass filter B;
2) the filter circuit includes a low-pass filter and a high-pass filter, and the ground of the low-pass filter is separated from the ground of the high-pass filter;
3) the filter circuit includes a low-pass trapper A and a low-pass trapper B, and the ground of the low-pass trapper A is separated from the ground of the low-pass trapper B;
4) the filter circuit includes a high-pass filter and a low-pass trapper, and the ground of the high-pass filter is separated from the ground of the low-pass trapper.

Furthermore, the switch group includes two or more sub-switch groups, and each sub-switch group includes at least one independent switch. The switching of the matching circuit is realized without increasing the loss of series switch.

Furthermore, the independent switches in the sub-switch group are integrated on an independent chip, or the independent switches in all the sub-switch groups are integrated on an independent chip.

Furthermore, two or more independent switches in the switch group are grouped and integrated on an independent chip.

Another object of the present invention is to provide a load line switching method, which adopts an external control signal to control the on/off of at least one independent switch in the switch group of the matching circuit with switchable load lines provided by the present invention, so that the load line of the independent switch has a signal.

A third object of the present invention is to provide a power amplifier composed of the matching circuit with switchable load lines provided by the present invention, including:

a power amplifier circuit, configured to amplify an input signal;

an output matching circuit, configured to match the output impedance of the power amplifier circuit, and the output matching circuit is the matching circuit with switchable load lines provided by the present invention.

The power amplifier can be connected with multiple loads at the same time. In addition, the on/off of one or several independent switches in the switch group is controlled by an external control signal, thus realizing the switching of load lines.

Furthermore, the power amplifier circuit includes:

an input transformer, including a plurality of output taps, and an input coil is loaded with a to-be-amplified signal;

an output transformer, including a plurality of input taps, the number of the input taps is matched with that of the output taps of the input transformer, and an output coil amplified signals;

an intermediate switch and a power-amplifier transistor, the plurality of output taps of the input transformer are connected with the input taps of the output transformer via the intermediate switch and the power-amplifier transistor, the intermediate switch is configured with a control signal to conduct the power-amplifier transistor connected in series with the intermediate switch, so that one or more of the output taps of the input transformer are communicated with the input taps of the output transformer, and an amplified signal is output after being transformed by the output transformer; and a first matching capacitor and a second matching capacitor, the first matching capacitor and the second matching capacitor are connected in parallel between taps at both ends of the input coil of the output transformer and ground.

Furthermore, a change-over switch is connected between taps at both ends of the input coil of the output transformer and the first matching capacitor. The capacitance value of the matching capacitor is controlled by the change-over switch, and the voltage on the input coil of the output transformer is adjusted, thereby realizing the adjustment of the load line and further ensuring the performance of the power amplifier provided by the invention.

Two or more of the intermediate switches are a group and integrated on a single chip; or two or more of the intermediate switches and the change-over switches are a group and integrated on a single chip.

The beneficial effects of the present invention is: the matching circuit provided by the invention adopts a switch group composed of at least two independent switches, and each independent switch forms a signal line to connect loads, so that multiple loads can be connected at the same time. In addition, the on/off of one or several independent switches in the switch group is controlled by an external control signal, thus realizing the switching of load lines. The whole matching circuit realizes signal line selection control by using switch group, the structure is simple and the control process is convenient.

The power amplifier provided by the invention adopts a multi-tap input transformer, and realizes the switching of the intermediate load line by controlling the on/off of the intermediate switch connected with the taps, so that the power amplifier forms different working states and achieves the best performance under different maximum output powers.

The intermediate switch and change-over switch are integrated on an independent chip by the process of CMOS/phemt/bihemt/SeGe/SOI, etc, or on a power amplifier chip by the process of CMOS/phemt/bihemt/SeGe/SOI, etc, which is easy to realize.

DETAILED DESCRIPTION OF THE INVENTION

The technical solution claimed in the present application will be further described in detail with reference to the drawings and specific embodiments.

Figure 1:
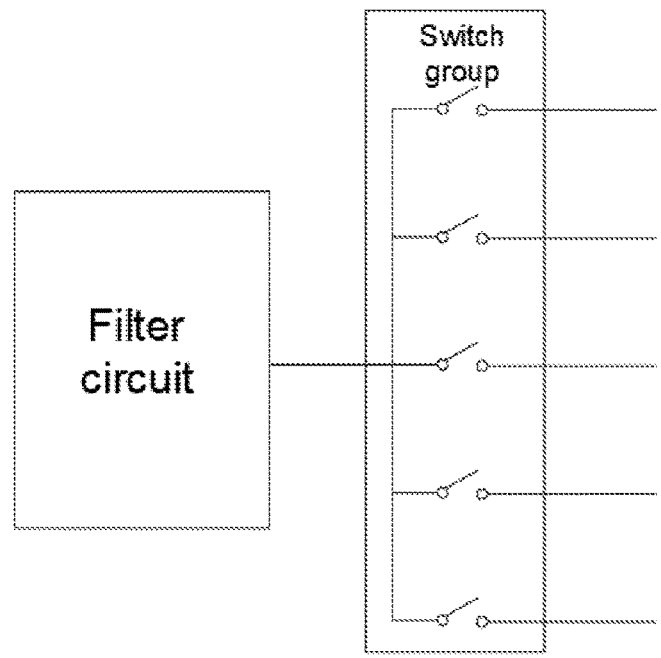
FIG. 1 is a functional block diagram of the matching circuit provided by the present invention.

The technical solution claimed by the present application is a matching circuit with switchable load lines. The functional block diagram of the matching circuit is shown in FIG. 1. The matching circuit matches an input impedance and an output impedance of a power amplifier, the power amplifier amplifies an input signal and outputs an amplified signal. The matching circuit includes a filter circuit and a switch group for load line selection, an output end of the filter circuit is connected to the switch group; the switch group includes at least two independent switches, each switch independently constitutes a signal line, and each switch is configured with an external control signal to control on/off. The matching circuit is connected to the output end or input end of the power amplifier for matching the input impedance or output impedance of the power amplifier, thus ensuring the stability of the signal.

An external control signal is adopted to control the on/off of at least one independent switch in the switch group of the matching circuit with switchable load lines, so that the load line of the independent switch has a signal, and the signal is output from the engaged switch.

Figure 2:
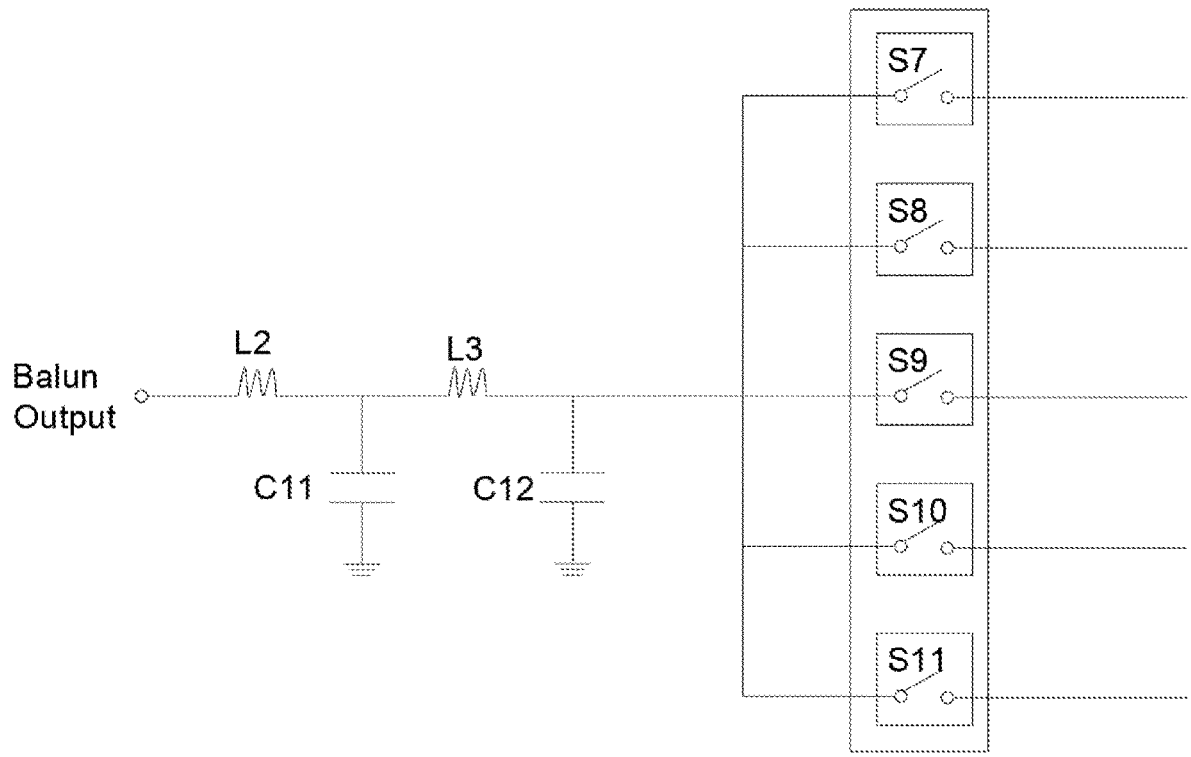
FIG. 2 is a schematic circuit diagram of the matching circuit provided by the present invention.

The filter circuit may adopt any one of the following structures or those from the prior art:

1. Low-pass filter A and low-pass filter B, the circuit connection is shown in FIG. 2. It includes a capacitor C11, a capacitor C12, an inductor L2 and an inductor L3. One end of inductor L2 is an input end connected to the output coil of output transformer T2, and the other end is connected to the switch group via inductor L3. The end of inductor L2 connected to inductor L3 is further grounded via capacitor C11, and the other end of inductor L3 connected with the switch group is grounded via capacitor C12. Inductor L2 and capacitor C11 constitute a low-pass filter A, and inductor L3 and capacitor C12 constitute a low-pass filter B.

Figure 3:
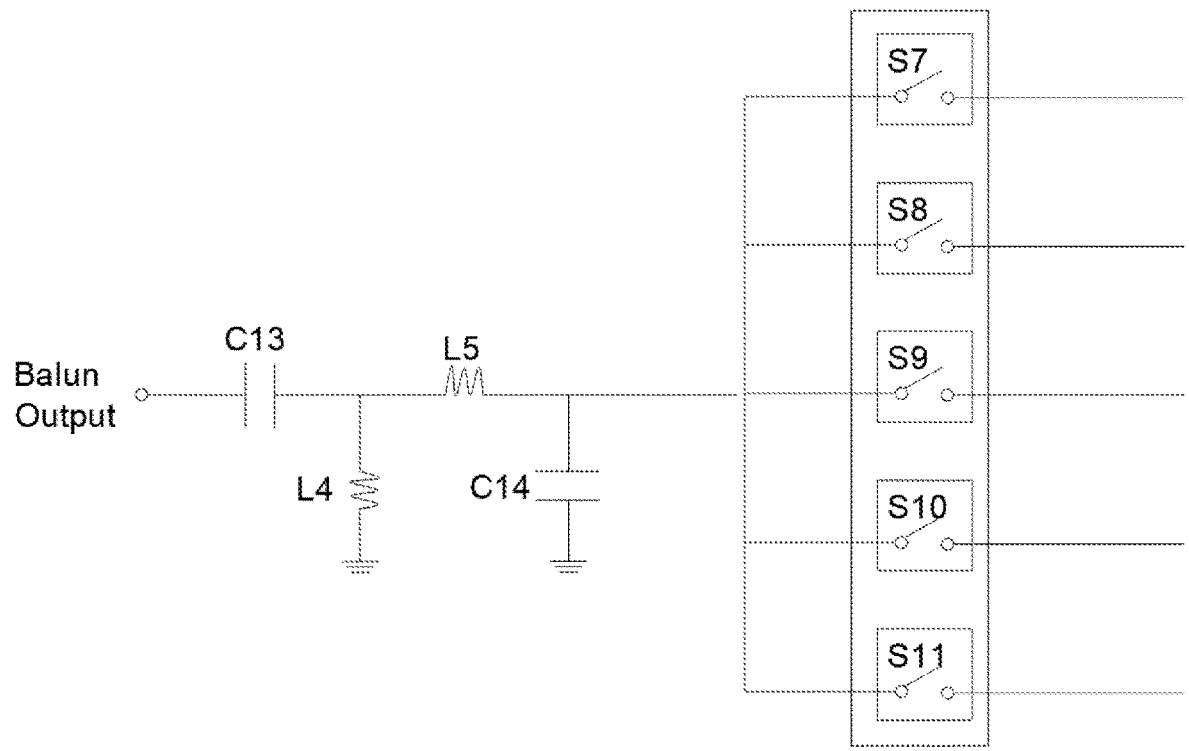
FIG. 3 is an another schematic circuit diagram of the matching circuit provided by the present invention.

2. High-pass filter and low-pass filter, the circuit connection is shown in FIG. 3. It includes a capacitor C13, an inductor L4, an inductor L5 and a capacitor C14. The first plate of capacitor C13 is an input end connected to the output coil of output transformer T2, and the second plate of capacitor C13 is connected to the switch group via inductor L5. The second plate of capacitor C13 is further grounded via inductor L4, and the end of inductor L5 connected to the switch group is grounded via capacitor C14. Capacitor C13 and inductor L4 constitute a high-pass filter, and inductor L5 and capacitor C14 constitute a low-pass filter.

Figure 4:
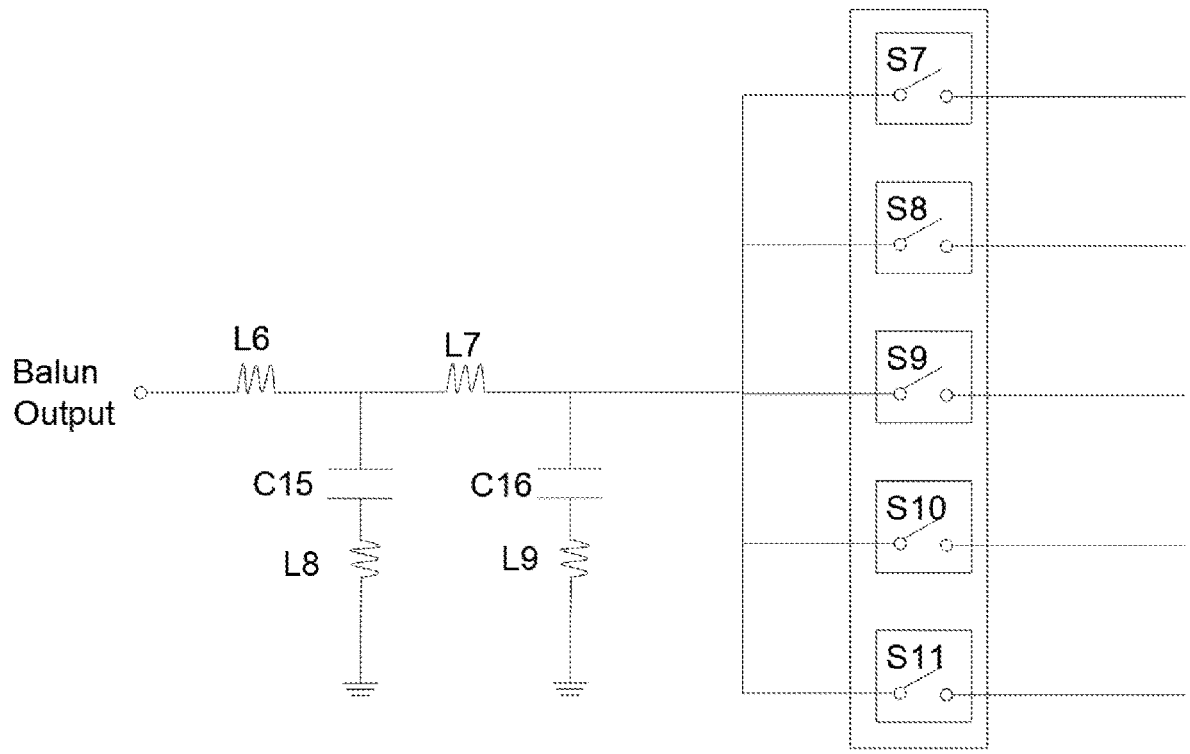
FIG. 4 is an another schematic circuit diagram of the matching circuit provided by the present invention.

3. Low-pass trapper A and low-pass trapper B, the circuit connection is shown in FIG. 4. It includes a capacitor C15, a capacitor C16, an inductor L6, an inductor L7, an inductor L8 and an inductor L9. One end of inductor L6 is an input end connected to the output coil of output transformer T2, and the other end is connected to the switch group via inductor L7. The end of inductor L6 connected to inductor L7 is further grounded via capacitor C15 and inductor L8, and the other end of inductor L7 connected with the switch group is grounded via capacitor C16 and inductor L9. Inductor L6, capacitor C15 and inductor L8 constitute a low-pass trapper A, and inductor L7, capacitor C16 and inductor L9 constitute a low-pass trapper B.

Figure 5:
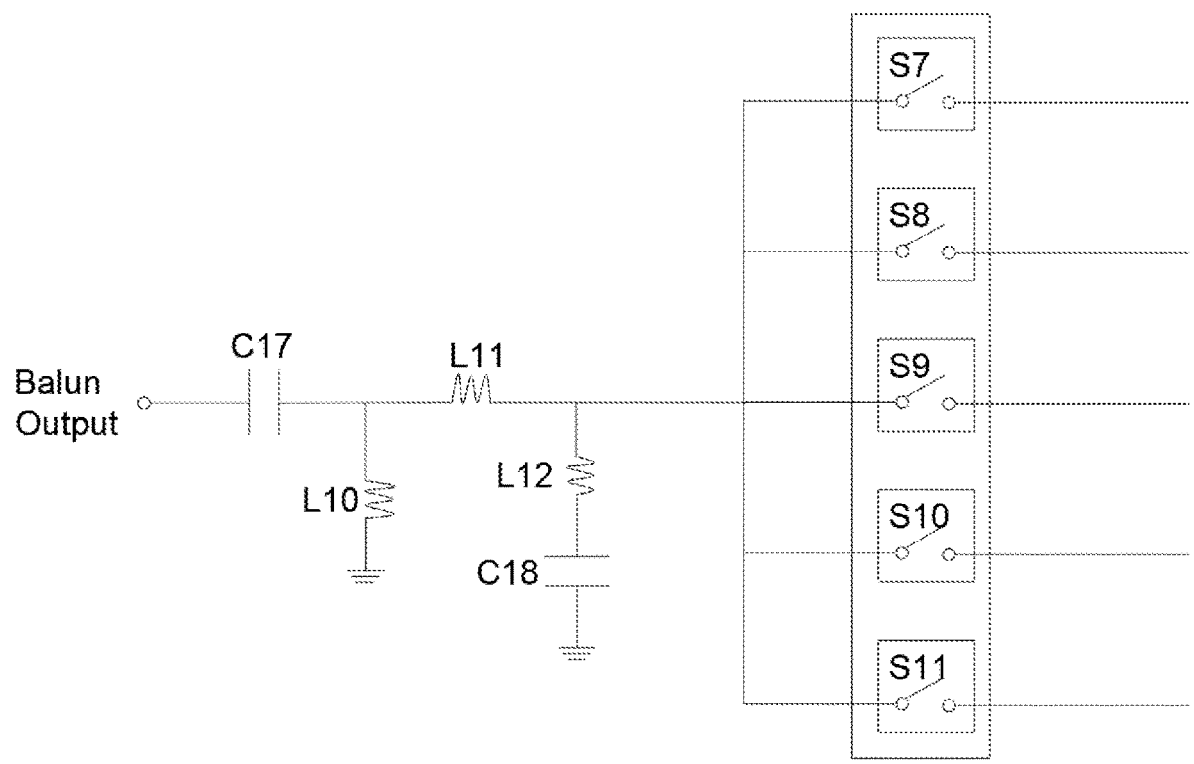
FIG. 5 is an another schematic circuit diagram of the matching circuit provided by the present invention.

4. High-pass filter and low-pass trapper, the circuit connection is shown in FIG. 5. It includes an inductor L10, an inductor L11, an inductor L12, a capacitor C17 and a capacitor C18. One end of capacitor C17 is an input end connected to the output coil of output transformer T2, and the other end is connected to the switch group via inductor L11. The end of capacitor C17 connected to inductor L11 is further grounded via inductor L10, and the other end of inductor L11 connected to switch group is grounded via inductor L12 and capacitor C18. Capacitor C17 and inductor L10 constitute a high-pass filter, and inductor L11, inductor L12 and capacitor C18 constitute a low-pass trapper.

The switch groups described in the above four types of filter circuits may consist of 4, 6, 8 or other numbers of switches. In the present application, the switches S7-S11 are used, and each switch is used as one output, and its on-off is controlled by an external control signal. The switches of the switch group may be integrated on a single chip, and the process technology may be SOI/CMOS/PHEMT/BIHEMT/SeGe, etc.

Figure 6:
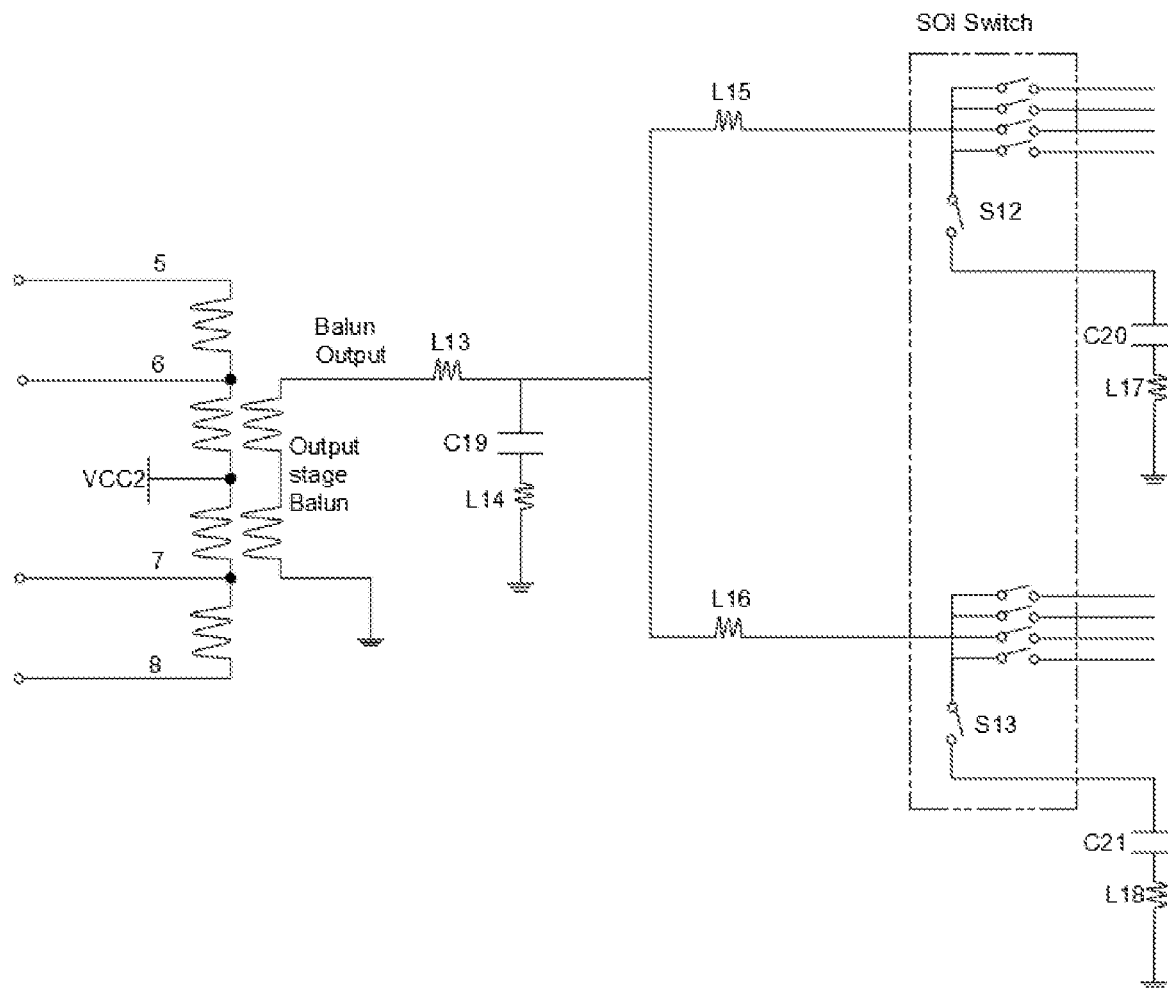
FIG. 6 is an another schematic circuit diagram of the matching circuit provided by the present invention.

In addition to the above structures, the matching circuit described in the present application can be one of the following structures:

A. As shown in FIG. 6, the matching circuit includes an inductor L13, inductor L14, inductor L15, inductor L16, inductor L17, inductor L18, a capacitor C19, capacitor C20, capacitor C21, a switch group A, switch group B, an independent switch S12 and independent switch S13. One end of inductor L13 is an input end connected to the output coil of output transformer T2, and the other end is connected to switch group A and switch group B via inductor L15 and inductor L16 respectively. The end of inductor L13 connected to inductor L15 and inductor L16 is further grounded via capacitor C19 and inductor L14. Switch group A is further grounded via independent switch S12, capacitor C20 and inductor L17, and switch group B is further grounded via independent switch S13, capacitor C21 and inductor L18. Switch group A and switch group B consist of several switches controlled by external control signals, each switch serves as one output, and independent switch S12 and independent switch S13 are controlled by external control signals.

Figure 7:
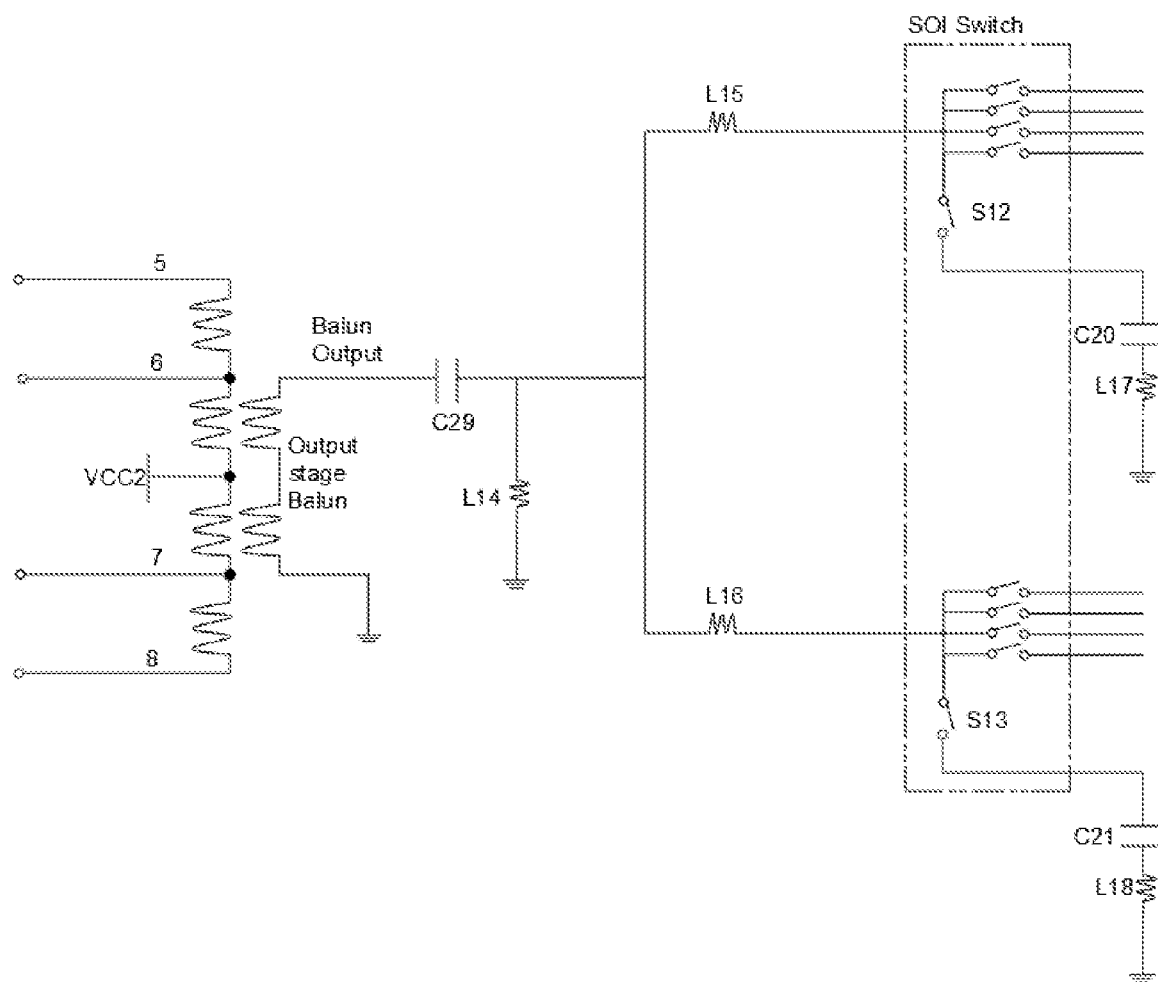
FIG. 7 is an another schematic circuit diagram of the matching circuit provided by the present invention.

B. As shown in FIG. 7, the matching circuit includes a capacitor C29, an inductor L14, inductor L15, inductor L16, inductor L17, inductor L18, a capacitor C20, capacitor C21, a switch group A, switch group B, an independent switch S12 and independent switch S13. The first plate of capacitor C29 is an input end connected to the output coil of output transformer T2, and the second plate is connected to switch group A and switch group B via inductor L15 and inductor L16 respectively. The second plate of capacitor C29 is further grounded via inductor L14. Switch group A is further grounded via independent switch S12, capacitor C20 and inductor L17, and switch group B is further grounded via independent switch S13, capacitor C21 and inductor L18. Switch group A and switch group B consist of several switches controlled by external control signals, each switch serves as one output, and independent switch S12 and independent switch S13 are controlled by external control signals.

Figure 8:
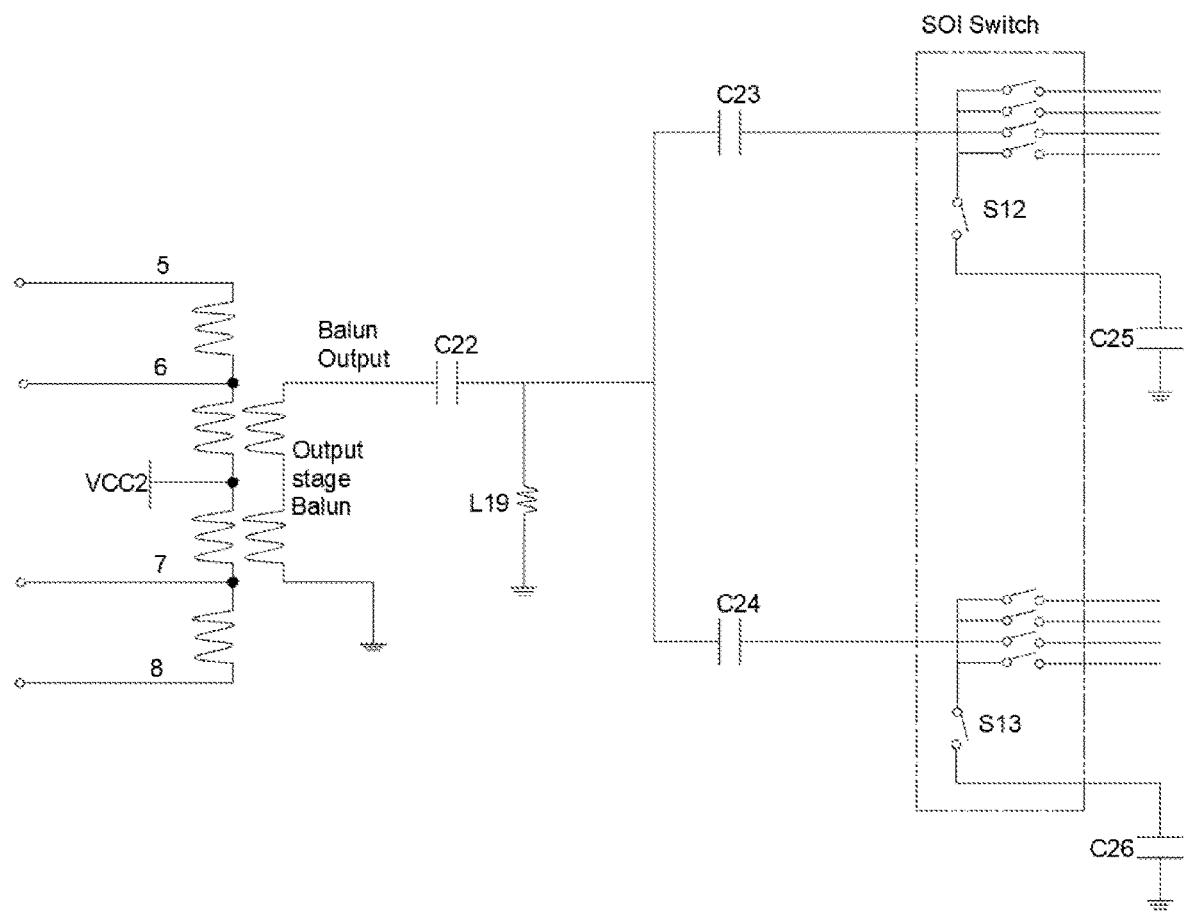
FIG. 8 is an another schematic circuit diagram of the matching circuit provided by the present invention.

C. As shown in FIG. 8, it includes capacitors C22~C26, inductor L19, switch group A, switch group B, independent switch S12 and independent switch S13. The first plate of capacitor C12 is an input end connected to the output coil of output transformer T2, and the other end is connected to switch group A and switch group B via capacitor C23 and capacitor C24 respectively. The end of the capacitor C22 connected to capacitor C23 and capacitor C24 is further grounded via inductor L19. Switch group A is further grounded via independent switch S12 and capacitor C25, and switch group B is further grounded via independent switch S13 and capacitor C26. Switch group A and Switch group B consist of several switches controlled by external control signals, each switch serves as one output, and independent switch S12 and independent switch S13 are controlled by external control signals.

Figure 9:
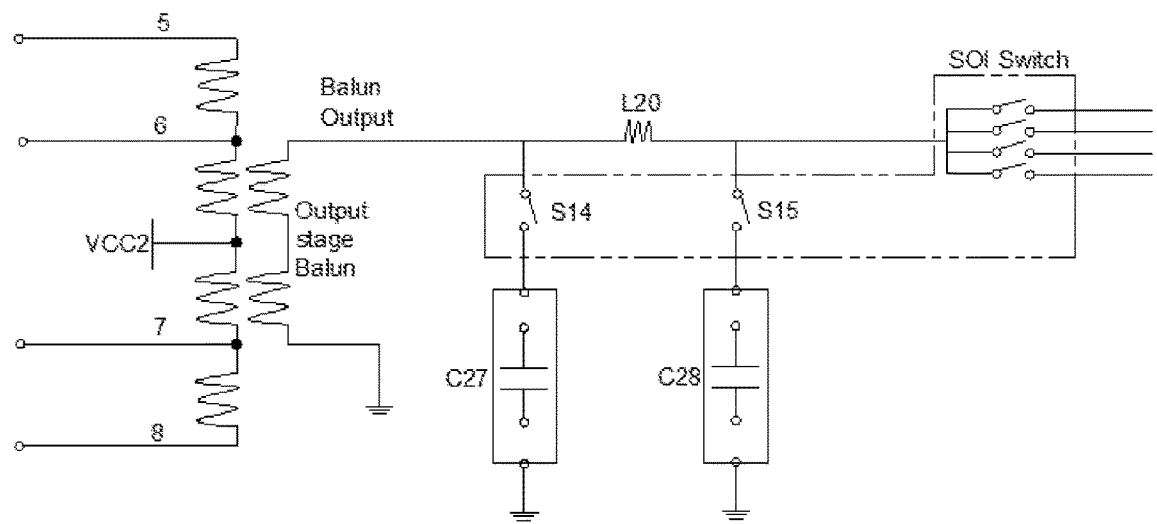
FIG. 9 is an another schematic circuit diagram of the matching circuit provided by the present invention.

D. As shown in FIG. 9, it includes capacitor C27, capacitor C28, inductor L20, switch group C, independent switch S14 and independent switch S15. The output end of output transformer T2 is grounded via independent switch S14 and capacitor C27, also, the output end of output transformer T2 is connected to switch group C via inductor L20, and the end of inductor L20 connected to switch group C is further grounded via independent switch S15 and capacitor C28. The switch group C consists of several switches controlled by external control signals, and each switch serves as one output. Those switches, independent switch S14 and independent switch S15 constituting switch group C may be independently arranged, or integrated on an independent SOI chip. Capacitor C27 and capacitor C28 constitute a trap circuit, and besides capacitor C27 and capacitor C28 described in the present application, any types of the existing trap circuit may be used. For example, capacitor C27 and capacitor C28 may be replaced with inductors, or inductors are connected in series on the branches of capacitor C27 and capacitor C28 respectively, to form a series circuit of capacitor+inductor.

Those switches, independent switch S12 and independent switch S13, which constitute switch group A and switch group B, described in A, B and C above, can be arranged independently, or integrated on an independent SOI chip.

Figure 10:
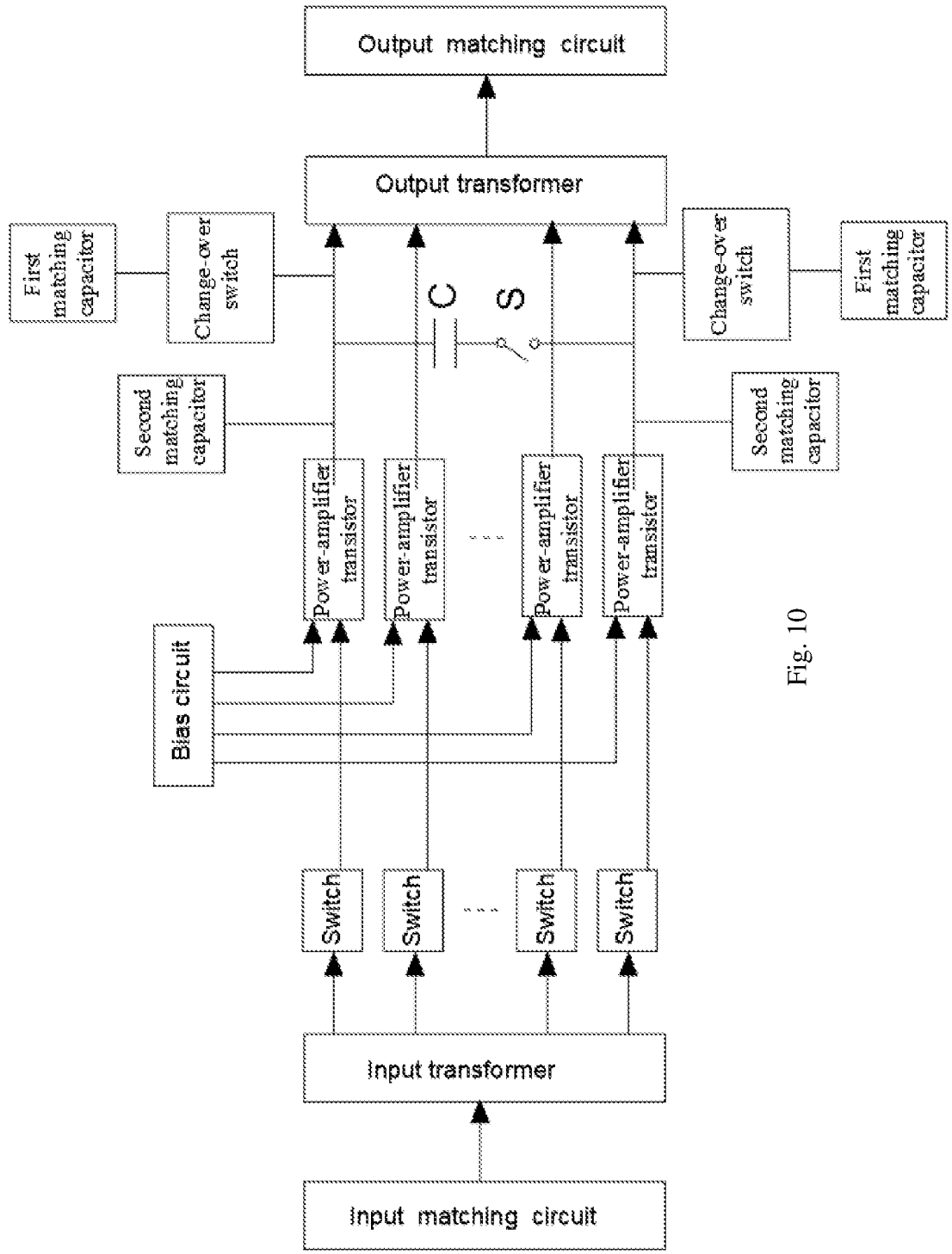
FIG. 10 is a functional block diagram of the power amplifier composed of the matching circuit provided by the present invention.

The matching circuit provided by the present invention can be used with any types of power amplifier circuit. As shown in FIG. 10, the power amplifier composed of the matching circuit provided by the present invention includes a power amplifier circuit, configured to amplify an input signal; and an output matching circuit, configured to match the output impedance of the power amplifier circuit, the output matching circuit is the matching circuit with switchable load lines provided by the present invention.

Figure 11:
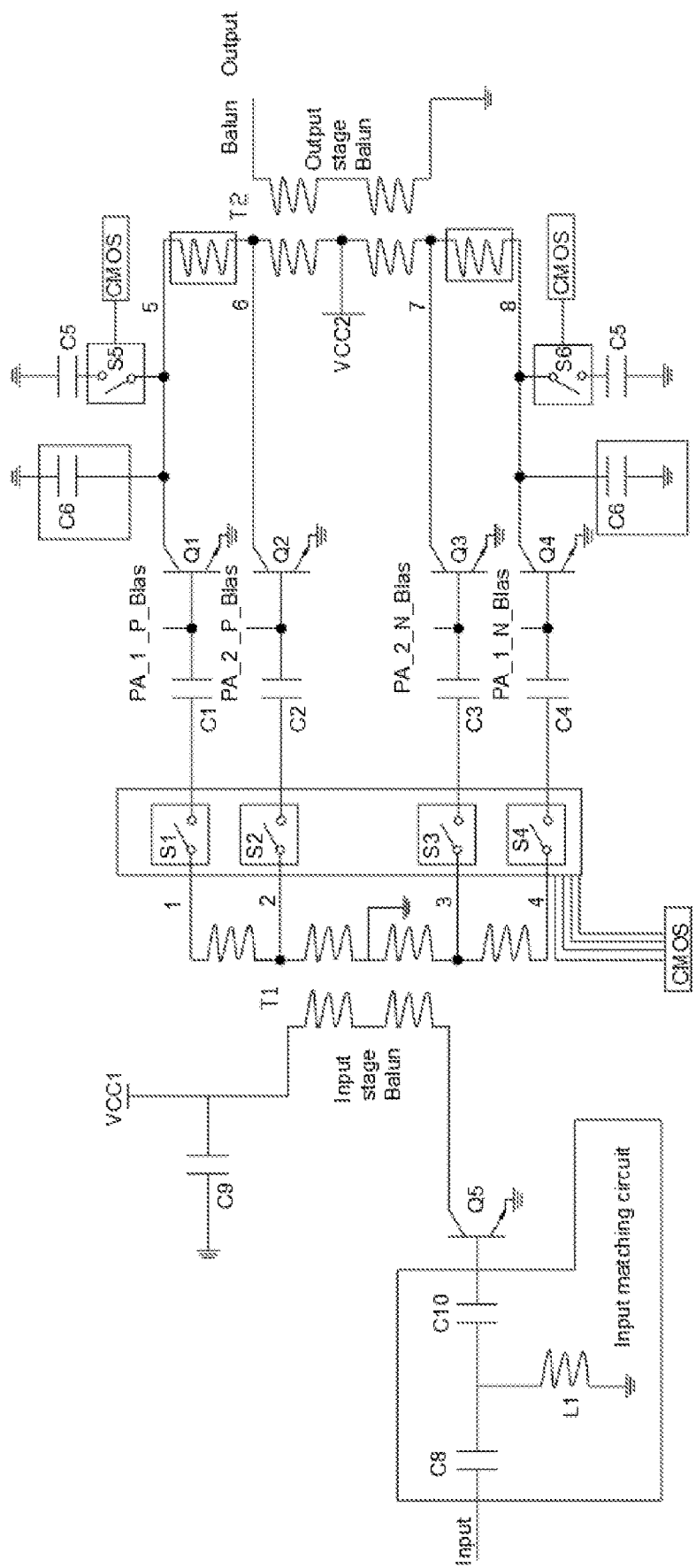
FIG. 11 is a schematic circuit diagram of the power amplifier composed of the matching circuit provided by the present invention.

The power amplifier circuit of the power amplifier may be any of the existing power amplifier circuit. The power amplifier circuit used in the present application is shown in FIG. 11, which includes:

an input transformer T1, including a plurality of output taps, and an input coil is loaded with a to-be-amplified signal;

an output transformer T2, including a plurality of input taps, the number of the input taps is matched with that of the output taps of the input transformer, and an output coil amplified signals;

an intermediate switch and a power-amplifier transistor, the plurality of output taps of the input transformer are connected with the input taps of the output transformer via the intermediate switch and the power-amplifier transistor, the intermediate switch is configured with a control signal to conduct the power-amplifier transistor connected in series with the intermediate switch, so that one or more of the output taps of the input transformer are communicated with the input taps of the output transformer, and an amplified signal is output after being transformed by the output transformer; and a first matching capacitor and a second matching capacitor, the first matching capacitor and the second matching capacitor are connected in parallel between taps at both ends of the input coil of the output transformer and ground.

The number of output taps of the input transform, and the number of input taps of the output transformer in the power amplifier can be 2, 4, 6 or other. The described power amplifier can be either a field effect transistor or a triode transistor. Here, the power amplifier disclosed by the present invention is further introduced by taking the example that the input and output transformers are configured with 4 taps and the power-amplifier transistor is a field effect transistor, as shown in FIG. 2. The output coil of the input transformer T1 includes tap 1, tap 2, tap 3 and tap 4, and the input coil of the matched output transformer T2 includes tap 5, tap 6, tap 7 and tap 8. Tap 1 is connected to the base of power amplifier Q1 via intermediate switch S1 and capacitor C1. The collector of power amplifier Q1 is connected to tap 5, and the emitter is grounded. Tap 2 is connected to the base of power amplifier Q2 via intermediate switch S2 and capacitor C2. The collector of power amplifier Q2 is connected to tap 6, and the emitter is grounded. Tap 3 is connected to the base of power amplifier Q3 via intermediate switch S3 and capacitor C3. The collector of power amplifier Q3 is connected to tap 7, and the emitter is grounded. Tap 4 is connected to the base of power amplifier Q4 via intermediate switch S4 and capacitor C4. The collector of power amplifier Q4 is connected to tap 8 and the emitter is grounded. Tap 5 and tap 8 are grounded via a first matching capacitor C5 and a second matching capacitor C6, respectively, which constitute a parallel connection.

One end of the input coil of input transformer T1 is connected to the power supply VCC1 and grounded via capacitor C9, and the other end is loaded with the signal to be amplified. The conduction of intermediate switches S1-S4 is controlled by external control signals. One end of the output coil of output transformer T2 is grounded, and the other end outputs an amplified signal.

The working state of the power amplifier provided by the invention is categorized as Class E power amplifier working state and Class $F^{-1}$ power amplifier working state. The input coil of input transformer T1 is loaded with a signal to be amplified, and a control signal is loaded on intermediate switches S1-S4 to make intermediate switches S1 and S4 conduct or intermediate switches S2 and S3 conduct. When intermediate switches S1 and S4 are turned on, power amplifier Q1 and Q4 are turned on, and the signal to be amplified is loaded on taps 5 and 8 of the input coil of output transformer T2. The load line consists of first matching capacitor C5 and output transformer T2, in this state, the power amplifier is in Class E power amplifier working state.

When intermediate switches S2 and S3 are turned on by the loaded control signal, power amplifiers Q2 and Q3 are turned on, and the signal to be amplified is loaded on taps 6 and 7 of the input coil of output transformer T2. The load line forms a 3rd order harmonic impedance by second matching capacitor C6 shown in the solid lined box of FIG. 2, the inductance between taps 5 and 6 shown in the solid lined box of FIG. 2, and the inductance between taps 7 and 8 shown in the solid lined box of FIG. 2. In this state, the power amplifier is in Class $F^{-1}$ power amplifier working state.

In order to better adjust the load line of the power amplifier, a change-over switch S5 and a change-over switch S6 are added on the basis of the above solution. Change-over switch S5 is connected in series between tap 1 and first matching capacitor C5, and change-over switch S6 is connected in series between tap 8 and first matching capacitor C5. The conduction of change-over switch S5 and change-over switch S6 is controlled by an external control signal, and the capacitance value of the matching capacitor can be controlled by the change-over switch.

In addition, the power amplifier provided by the invention further includes a selection circuit mainly composed of a selection switch S and a capacitor C, and the selection circuit is connected in series between taps at both ends of the input coil of the output transformer.

Figure 12:
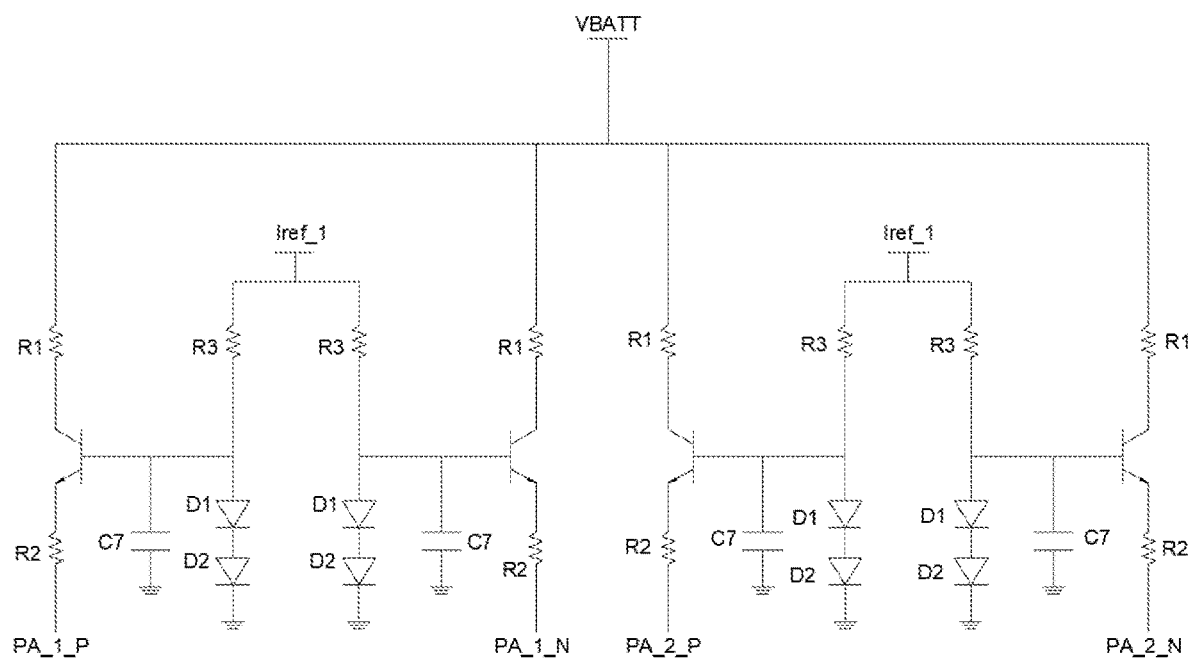
FIG. 12 is a schematic circuit diagram of the bias circuit described in the present invention.

In order to make the power amplifier amplify the signal voltage without distortion, the power amplifier provided by the present invention also includes a bias circuit, the schematic diagram of the bias circuit is shown in FIG. 12, which includes bias branches with the same number as the power amplifier, each bias branch includes an output end, and the output control signal is loaded on the control end of the power amplifier. Each bias branch includes a switch transistor T1, a resistor R1, a resistor R2, a resistor R3, a capacitor C7, a diode D1 and a diode D2. The power supply end of the switch transistor T1 is connected with an external control signal (such as a power supply) via resistor R1, and resistor R2 is connected with the output end of switch transistor T1. The control end of switch transistor T1 is grounded via capacitor C7, switch transistor T1 is also connected to the anode of diode D1, the cathode of diode D1 is connected to the anode of diode D2, and the cathode of diode D2 is grounded. The control end of switch transistor T1 is also connected with an external control signal via resistor R3. Switch transistor T1 may be a triode transistor or a field effect tube.

In order to ensure the stability of the signal loaded on input transformer T1, the power amplifier further includes an input matching circuit for filtering the to-be-amplified signal and a preamplifier Q5. The input matching circuit includes an input filter circuit, and the input filter circuit can be any of the existing capacitance filter circuit, inductance filter circuit, RC filter circuit or LC filter circuit. The input filter circuit used here includes a capacitor C8, a capacitor C10 and an inductor L1. The first plate of capacitor C8 is used as an input end for loading signals, and the second plate of capacitor C8 is connected to the control end of preamplifier Q5 via capacitor C10. The second plate of capacitor C8 is further grounded via inductor L1, and the power supply end of preamplifier Q5 is grounded, the output end is connected to the input coil of input transformer T1. The preamplifier Q5 may be a triode transistor or a field effect tube.

The intermediate switches and change-over switches described in the present application can be arranged independently, or they can be integrated on an independent SOI chip as a group of two or more switches or all switches. For example, intermediate switch S1 and intermediate switch S4 are a group, switch S2 and intermediate switch S3 are a group, change-over switch S5 and change-over switch S6 are a group, or intermediate switches S1~S4 are a group, or intermediate switches S1~S4, change-over switch S5 and change-over switch S6 are a group, or others.

The power amplifier provided by the invention may adopt a distributed circuit structure, or all components can be integrated on a chip by the process of bihemt/SOI/phemt/CMOS/SeGe to form an integrated circuit. It is also possible to integrate some components on one chip, the other components on another chip, and connect the chips via signal lines. For example, two or more than two or all of the intermediate switches may be integrated as a group on an independent SOI chip. Two or more than two or all of the change-over switches may be integrated as a group on an independent SOI chip. The output matching circuit, input matching circuit, preamplifier, input transformer and output transformer may be integrated on an independent SOI chip, and each independent SOI chip is connected via a signal line.

In the present application, input transformer T1 and output transformer T2 may be any types of the existing transformer. A balanced-unbalanced transformer (Balun) is used in the present application.

The above embodiments are only used to illustrate the technical solution of the present application, not intended to limit it. Modifications or equivalent substitutions made by those skilled in the art, which do not deviate from the spirit or scope of the present application, shall be included in the protection scope of the claims.

What is claimed is:

1. A matching circuit with switchable load lines, the matching circuit matches an input impedance and an output impedance of a power amplifier, the power amplifier amplifies an input signal and outputs an amplified signal;

characterized by comprising a filter circuit and a switch group for load line selection, an output end of the filter circuit is connected to the switch group; the switch group comprises at least two independent switches, each switch independently constitutes a signal line, and each switch is configured with an external control signal to control on/off;

the power amplifier comprises:

a power amplifier circuit, configured to amplify an input signal;

an output matching circuit, configured to match the output impedance of the power amplifier circuit, and the output matching circuit is the matching circuit with switchable load lines;

wherein the power amplifier circuit comprises:

an input transformer, comprising a plurality of output taps, and an input coil is loaded with a to-be-amplified signal;

an output transformer, comprising a plurality of input taps, the number of the input taps is matched with that of the output taps of the input transformer, and an output coil amplified signals;

an intermediate switch and a power-amplifier transistor, the plurality of output taps of the input transformer are connected with the input taps of the output transformer via the intermediate switch and the power-amplifier transistor, the intermediate switch is configured with a control signal to conduct the power-amplifier transistor connected in series with the intermediate switch, so that one or more of the output taps of the input transformer are communicated with the input taps of the output transformer, and the amplified signal is output after being transformed by the output transformer; and a first matching capacitor and a second matching capacitor, the first matching capacitor and the second matching capacitor are connected in parallel between taps at both ends of the input coil of the output transformer and ground.

2. The matching circuit with switchable load lines of claim 1, wherein the filter circuit has one of the following structures:
   1) The filter circuit comprises a low-pass filter A and a low-pass filter B, and the ground of the low-pass filter A is separated from the ground of the low-pass filter B;
   2) The filter circuit comprises a low-pass filter and a high-pass filter, and the ground of the low-pass filter is separated from the ground of the high-pass filter;
   3) The filter circuit comprises a low-pass trapper A and a low-pass trapper B, and the ground of the low-pass trapper A is separated from the ground of the low-pass trapper B;
   4) The filter circuit comprises a high-pass filter and a low-pass trapper, and the ground of the high-pass filter is separated from the ground of the low-pass trapper.

3. The matching circuit with switchable load lines of claim 1, wherein the switch group comprises two or more sub-switch groups, and each sub-switch group comprises at least one independent switch.

4. The matching circuit with switchable load lines of claim 3, wherein the independent switches in the sub-switch group are integrated on an independent chip, or the independent switches in all the sub-switch groups are integrated on an independent chip.

5. The matching circuit with switchable load lines of claim 1, wherein two or more independent switches in the switch group are grouped and integrated on an independent chip.

6. A load line switching method, wherein the switching method adopts an external control signal to control the on/off of at least one independent switch in the switch group of the matching circuit with switchable load lines of claim 1, so that the load line of the independent switch has a signal.

7. The power amplifier of claim 1, wherein a change-over switch is connected between taps at both ends of the input coil of the output transformer and the first matching capacitor.

8. The power amplifier of claim 7, wherein two or more of the intermediate switches are a group and integrated on a single chip; or two or more of the intermediate switches and the change-over switches are a group and integrated on a single chip.

* * * * *